United States Patent
Maeda et al.

(10) Patent No.: US 6,680,988 B1
(45) Date of Patent: Jan. 20, 2004

(54) NON-LINEAR EXTRACTION CIRCUIT AND CLOCK EXTRACTION CIRCUIT

(75) Inventors: Masaaki Maeda, Tokyo (JP); Yoshikazu Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/531,147

(22) Filed: Mar. 17, 2000

(30) Foreign Application Priority Data

Aug. 13, 1999 (JP) .......................................... 11-229066

(51) Int. Cl.[7] .............................. H04L 7/02; H04L 7/00
(52) U.S. Cl. ........................................ 375/354; 375/360
(58) Field of Search ................................ 375/354, 360; 359/152, 189

(56) References Cited

U.S. PATENT DOCUMENTS

| | | | | |
|---|---|---|---|---|
| 5,237,416 A | * | 8/1993 | Ito et al. ...................... 348/614 |
| 5,619,541 A | * | 4/1997 | Van Brunt et al. ........... 375/360 |
| 5,640,523 A | * | 6/1997 | Williams ..................... 375/360 |
| 5,646,966 A | * | 7/1997 | Chaki et al. ................. 375/368 |
| 5,781,587 A | * | 7/1998 | Bruce ......................... 375/293 |
| 6,411,665 B1 | * | 6/2002 | Chan et al. .................. 375/360 |

FOREIGN PATENT DOCUMENTS

| | | | |
|---|---|---|---|
| JP | S62-120138 | * | 6/1987 |
| JP | 64-2436 | * | 1/1989 |
| JP | 8-4261 | | 1/1996 |

* cited by examiner

*Primary Examiner*—Stephen Chin
*Assistant Examiner*—Lawrence Williams
(74) *Attorney, Agent, or Firm*—Wenderoth, Lind & Ponack, L.L.P.

(57) ABSTRACT

For enabling a stable clock signal to be extracted from even an input signal of which the duty factor is made worse, there is presented a clock extraction circuit applicable to an optical signal receiver equipped in an apparatus for use in the optical data communication. The clock extraction circuit includes a rising edge differential circuit (12) for differentiating the input signal at the rising edge thereof, a first monostable multivibrator (13) for processing the output from the differential circuit (12), a second monostable multivibrator (14) for processing the output from the first monostable multivibrator (13), an OR gate (15) for carrying out the logical OR between the output signals from the first and second monostable multivibrators (13) and (14) and circuitry for variably varying output pulse width, which processes the result of the logical OR. With this configuration, it is made possible to extract a stable clock signal from an input signal even when the duty factor of the input signal is made worse.

9 Claims, 15 Drawing Sheets

NON-LINEAR EXTRACTION CIRCUIT AND CLOCK EXTRACTION CIRCUIT

BACKGROUND OF THE INVENTION

The present invention relates to a non-linear extraction circuit and a clock extraction circuit. For instance, these non-linear extraction circuit and clock extraction circuit can be arranged in the clock extraction portion of an optical signal receiver used in the field of optical communication, in order to stably extract a clock pulse from a data signal as it is received.

Heretofore, an optical signal receiver 90 as shown in FIG. 13 of the accompanying drawings has been used for regenerating an original signal from the signal that has been transmitted through an optical fiber, thereby the level of the signal being lowered and the wave form thereof being distorted. This optical signal receiver 90 has three functions, so called, 3R-function, that is, the functions of Reshaping the wave form of the electric signal obtained by the photo-electric conversion by means of an equalizing amplification portion 92, Retiming (or extracting) clock pulses in synchronization with the input data, and then, Regenerating the original signal by means of an identification and regeneration portion 93.

The clock extraction portion 94 arranged in the optical signal receiver 90 includes a non-linear extraction circuit 95 for extracting clock frequency components from the input data, a timing filter 96 for extracting only a fundamental frequency component from the clock frequency components, and a limiting amplification circuit 97 for converting a very small sinusoidal signal into a rectangular signal. This clock extraction portion 94 is required to constantly perform the identification and regeneration operation at the most suitable identification point whatever bit rates may be, and is provided in general with means for optimizing the clock phase.

A non-linear extraction circuit made up of a monostable multivibrator (referred to as "Mono-Multi" hereinafter) and a differential circuit, is disclosed as means for optimizing the clock phase by the JP Patent Publication No. H8(1996)-4261 which is incorporated herein by reference.

According to the circuit configuration disclosed by the JP Patent Publication No. H8(1996)-4261, the clock phase may be optimized. However, in case the duty factor of the input data is made worse, the amplitude spectrum of the extraction timing component is so lowered that there might be a possibility that the output level of the timing filter is lowered. Moreover, in the worst case, there might be a possibility of missing clocks and a generation of clock jitter.

FIG. 14 is a block diagram showing the configuration of a prior art non-linear extraction circuit 100. FIG. 15 is a timing chart indicating the operation of extracting the timing component by the non-linear extraction circuit 100 when the duty factor A/B of the input data signal S70 is made lower than 1 due to the deterioration thereof. As will be seen from the figure, the phase is shifted at every pulse in the repetitive pulses S73 of the timing component. As the results of this, the deterioration is caused in the amplitude spectrum of the timing component.

Therefore, the present invention has been made in view of problems as described above, and the first object of the invention is to provide a non-linear extraction circuit capable of executing the stable extraction of the timing component, even when the duty factor of the input data signal is made worse.

The second object of the invention is to provide a clock extraction circuit to which there is added means for varying output pulse width (referred to as "output pulse width varying means" hereinafter) to the non-linear extraction circuit.

The third object of the invention is to provide a clock extraction circuit capable of compensating the clock phase variation caused in the constituents making up of the clock extract portion of the optical signal receiver due to the variation in the operational environment, the constituents being the non-linear extraction circuit, the timing filter, and limiting amplifier, and capable of executing the stable extraction of the timing component, thereby optimizing clock phase.

SUMMARY OF THE INVENTION

In order to solve such problems as described above, according to the first aspect of the invention, there is provided a non-linear extraction circuit including a differential circuit which differentiates an input data signal at the point of change (rising or falling point or edge) thereof and generates a differential pulse. A first Mono-Multi is connected with the differential circuit and outputs a first pulse signal in synchronization with the differential pulse. A second Mono-Multi is connected with the first Mono-Multi and outputs a second pulse signal in synchronization with the first pulse signal. An OR circuit carries out a logical OR between the first pulse signal and the second pulse signal.

According to the second aspect of the invention, there is provided a clock extraction circuit including a differential circuit which differentiates an input data signal at the point of change (rising or falling point or edge) thereof and generates a differential pulse. A first Mono-Multi is connected with the differential circuit and outputs a first pulse signal in synchronization with the differential pulse. A second Mono-Multi is connected with the first Mono-Multi and outputs a second pulse signal in synchronization with the first pulse signal. An OR circuit carries out a logical OR between the first pulse signal and the second pulse signal. An output pulse width varying means is connected with the OR circuit and variably changes the pulse width of the output pulse signal outputted from the OR circuit.

According to the third aspect of the invention, there is provided a clock extraction circuit in which an output pulse width varying means includes a delay circuit which is connected and delays the output pulse signal from an OR circuit. Further an RS flip-flop circuit is set by the output signal from the OR circuit and is reset by the output signal from the delay circuit.

According to the fourth aspect of the invention, there is provided a clock extraction circuit in which an output pulse width varying means includes a third Mono-Multi which is connected with an OR circuit and outputs the third pulse signal in synchronization with the output pulse signal from the OR circuit.

According to the fifth aspect of the invention, there is provided a clock extraction circuit including a non-linear extraction circuit extracting clock frequency components from an input data signal; a timing filter extracting only a fundamental frequency component from the clock frequency components; a limiting amplifier converting a sinusoidal signal outputted from the timing filter into a rectangular signal; a ½ frequency divider for carrying out ½ frequency division with respect to the output signal from the limiting amplifier; an EXOR circuit carrying out logical EXOR between the output signal from the ½ frequency divider and the input data signal; an average value detector which is connected with the EXOR circuit and detects the average value of the output signal from the EXOR circuit; a comparator comparing the output voltage of the average value detector with a reference voltage Vref, a low-pass filter (LPF) which is connected with the comparator and allows only the low frequency part of the output signal from the comparator to pass; and means for variably changing phase (referred to as "a phase varying means" hereinafter) which is connected with the low-pass filter (LPF) and controls the phase of the output signal from the non-linear extraction circuit.

According to the sixth aspect of the invention, there is provided a clock extraction circuit including a differential circuit which differentiates an input data signal at the point of change thereof and generates a differential pulse; a first Mono-Multi which is connected with the differential circuit and outputs a first pulse signal in synchronization with the differential pulse; a second Mono-Multi which is connected with the first Mono-Multi and outputs the second pulse signal in synchronization with the first pulse signal; an OR circuit carrying out the logical OR between the first pulse signal and the second pulse signal; an output pulse width varying means which is connected with the OR circuit and variably changes the pulse width of the output pulse signal from the OR circuit; a timing filter which is connected with the output pulse width varying means and extracts only a fundamental frequency component from the frequency components of the output signal from the output pulse width varying means; a limiting amplifier which is connected with the timing filter and converts a sinusoidal signal from the timing filter into a rectangular signal; a ½ frequency divider for carrying out ½ frequency division with respect to the output signal from the limiting amplifier; an EXOR circuit for performing a logical EXOR between the output signal from the ½ frequency divider and the input data signal; an average value detector which is connected with the EXOR circuit and detects the average value of the output signal from the EXOR circuit; a comparator comparing the output voltage of the average value detector with a reference voltage Vref; and a low-pass filter (LPF) which is connected with the comparator, allows only the low frequency part of the output signal from said comparator to pass, and supplies the passed to the first Mono-Multi.

According to the seventh aspect of the invention, there is provided a clock extraction circuit in which a first Mono-Multi includes a variable capacitance diode varying the capacitance thereof in response to the voltage applied thereto, and a low-pass filter (LPF) connected with the variable capacitance diode.

According to the eighth aspect of the invention, there is provided a clock extraction circuit including a differential circuit which differentiates an input data signal at the point of change thereof and generates a differential pulse; a first Mono-Multi which is connected with the differential circuit and outputs a first pulse signal in synchronization with the differential pulse; a second Mono-Multi which is connected with the first Mono-Multi and outputs a second pulse signal in synchronization with the first pulse signal; an OR circuit carrying out a logical OR between the first pulse signal and the second pulse signal; an output pulse width varying means which is connected with the OR circuit and variably changes the pulse width of the output pulse signal from the OR circuit; a timing filter which is connected with the output pulse width varying means and extracts only a fundamental frequency component from the frequency components of the output signal from the output pulse width varying means; a limiting amplifier which is connected with the timing filter and converts a sinusoidal signal outputted from the timing filter into a rectangular signal; a 1/(2N) frequency divider for carrying out a 1/(2N) frequency division with respect to the output signal from the limiting amplifier; a 1/N frequency divider for carrying out a 1/N frequency division with respect to the input data signal; an EXOR circuit for carrying out the logical EXOR between the output signal from the 1/(2N) frequency divider and the output signal from the 1/N frequency divider; an average value detector which is connected with the EXOR circuit and detects the average value of the output signal from the EXOR circuit; a comparator comparing the output voltage of the average value detector with a reference voltage Vref; and a low-pass filter (LPF) which is connected with the comparator, allows only the low frequency part of the output signal from the comparator to pass, and supplies the passed to the first Mono-Multi.

According to the ninth aspect of the invention there is provided a clock extraction circuit in which a first Mono-Multi includes a variable capacitance diode varying the capacitance thereof in response to the voltage applied thereto, and a low-pass filter (LPF) connected with the variable capacitance diode.

BRIEF DESCRIPTION OF THE DRAWINGS

Preferred embodiments according to the invention will now be described in detail in the following, with reference to the accompanying drawings, in which.

Here, it should be noted that in order to avoid redundancy in the following description, like components of the invention having like functions are designated like reference numerals throughout all the figures as mentioned above.

Furthermore, it should be also noted that the following description of the invention will be made assuming that there is used a differential circuit which generates a differential pulse by differentiating a pulse at the rising edge thereof. This differential circuit will be referred to as "rising edge differential circuit" hereinafter.

DETAILED DESCRIPTION OF THE PREFERRED EMBODIMENT

Figure 1:
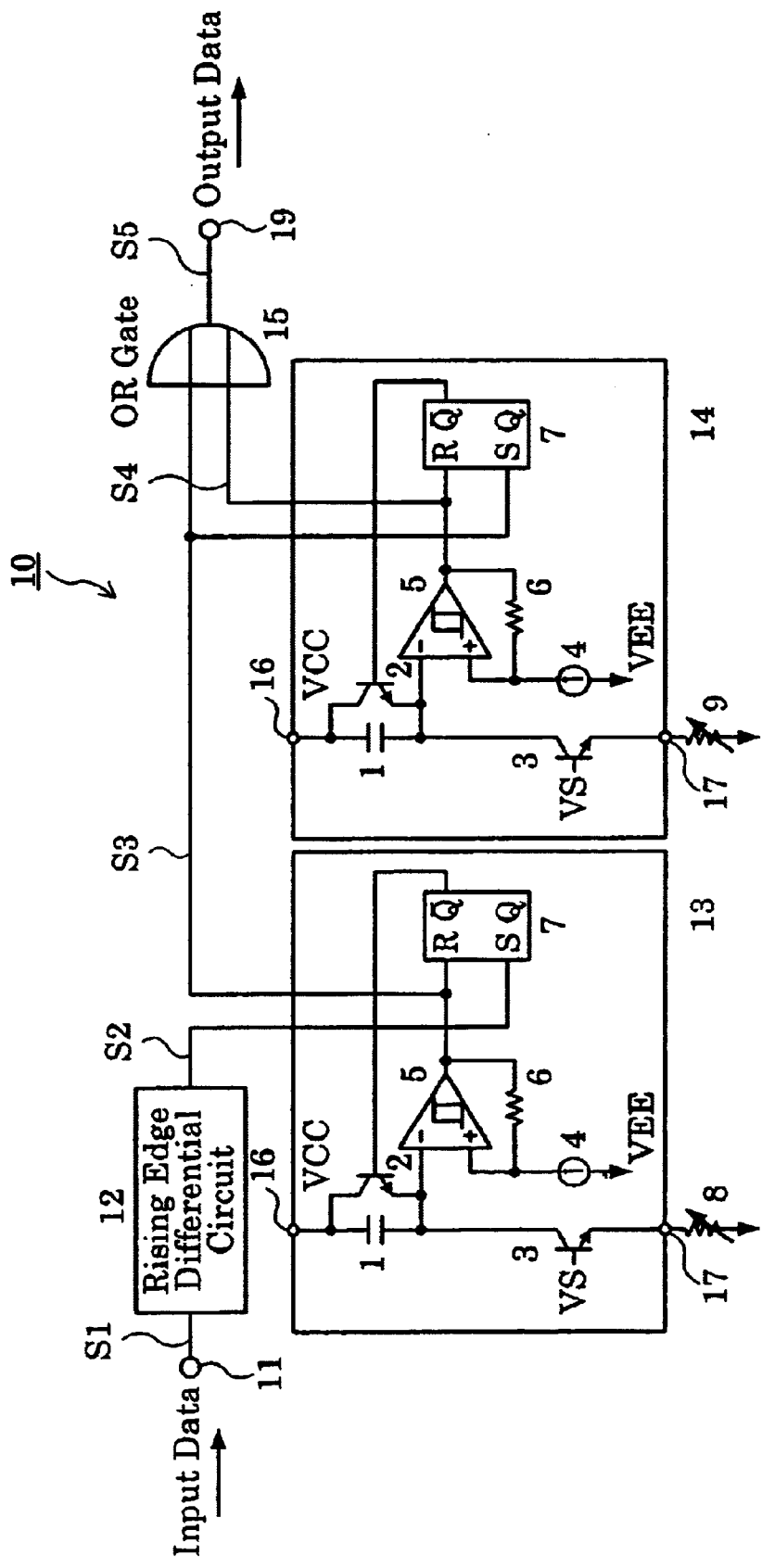
FIG. 1 is a circuit diagram of a non-linear extraction circuit according to the first embodiment of the invention.

Referring now once again to the drawings, FIG. 1 is a circuit diagram showing the configuration of a non-linear extraction circuit 10 according to the first embodiment of the invention.

The non-linear extraction circuit 10 includes an input terminal 11 receiving an input data signal S1, an output terminal 19 outputting an output data signal S5, a rising edge differential circuit 12 which is formed with a differential amplifier or the like, a first Mono-Multi 13 connected to the rising edge differential amplifier 12, the second Mono-Multi 14 connected to the first Mono-Multi 13, and an OR gate 15 carrying out the logical OR between the output signal from the first Mono-Multi 13 and the output signal from the second Mono-Multi 14.

The first Mono-Multi 13 and the second Mono-Multi 14 respectively include a capacitor 1, a transistor 2, another transistor 3, a constant current source 4, a voltage comparator 5, a resister 6, and an RS flip-flop circuit 7. Furthermore, an external variable resistor 8 is connected with the first Mono-Multi 13 while another variable resistor 9 is connected with the second Mono-Multi 14.

Here, the term "Mono-Multi" is used to represent a monostable multivibrator, that is a circuit which may output a pulse having a predetermined pulse width one time when it is triggered by an input trigger pulse.

Figure 2:
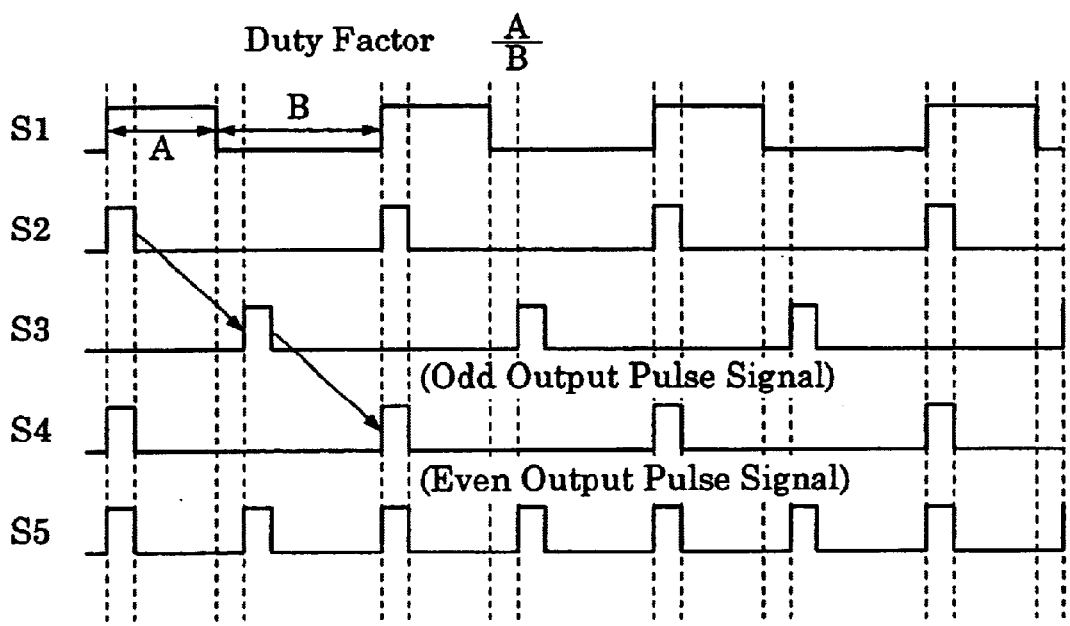
FIG. 2 is a timing chart for describing the operation of the first non-linear extraction circuit.

FIG. 2 is a timing chart for describing the operation of the non-linear extraction circuit 10 according to the invention. An input data signal S1 with a deteriorated duty factor A/B is converted into differential pulses S2 in synchronization with the rising edge of the data signal S1 by the rising edge differential circuit 12. Differential pulses S2 are then inputted to the set pulse input terminal of the RS flip-flop circuit 7 arranged in the first Mono-Multi 13. Then, the first Mono-Multi 13 outputs reset pulses S3(referred to as "odd output pulse signal" hereinafter). The pulse width of this reset pulse S3 is determined by a discharge time constant which is obtained based on two factors, that is, a discharge duration of the capacitor 1 and a value of the current that flows through the transistor 3 in correspondence with a resistance value of the external variable resistor 8.

The external variable resistor 8 of the first Mono-Multi 13 is set to such a resistance value that determines the phase of the odd output pulse signal S3. This odd output pulse signal S3 is inputted to the set pulse input terminal of the RS flip-flop circuit 7 arranged in the second Mono-Multi 14. The pulse width of reset pulse S4 (referred to as "even output pulse signal" hereinafter) outputted from the second Mono-Multi 14 is determined based on a discharge duration of the capacitor 1 arranged in the second Mono-Multi 14 and a value of resistance of the external variable resistor 9. The resistance value of the external variable resistor 9 of the second Mono-Multi 14 is set such that the phase of the even output pulse signal is set so as to be delayed by accurately half a period with respect to the phase of the odd output pulse signal.

The OR gate 15 carries out the logical OR between the odd output pulse signal outputted from the first Mono-Multi 13 and the even output pulse signal outputted from the second Mono-Multi 14, and then outputs the output pulse S5.

As will be seen from FIG. 2, there is always kept constant the phase difference between the phase of the even output pulse signal S4 determined by the discharge time constant of the second Mono-Multi 14 and the phase of the odd output pulse signal S3 determined by the discharge time constant of the first Mono-Multi 13. The first Mono-Multi 13 is used for setting the phase of the output pulse S5 while the second Mono-Multi 14 is used for correcting the displacement in the repetitive period of the output pulse S5.

With the non-linear extraction circuit 10 according to the current embodiment, should the duty factor A/B of the input data signal S1 be deteriorated, it would be made possible to extract stable timing components from the input data signal S1 without causing any displacement in the phase and to supply it to a timing filter (not shown) provided in the latter stage. Accordingly, the drop in the output level of the timing filter can be avoided, and the missing of clock and generation of clock jitter can be prevented.

Figure 3:
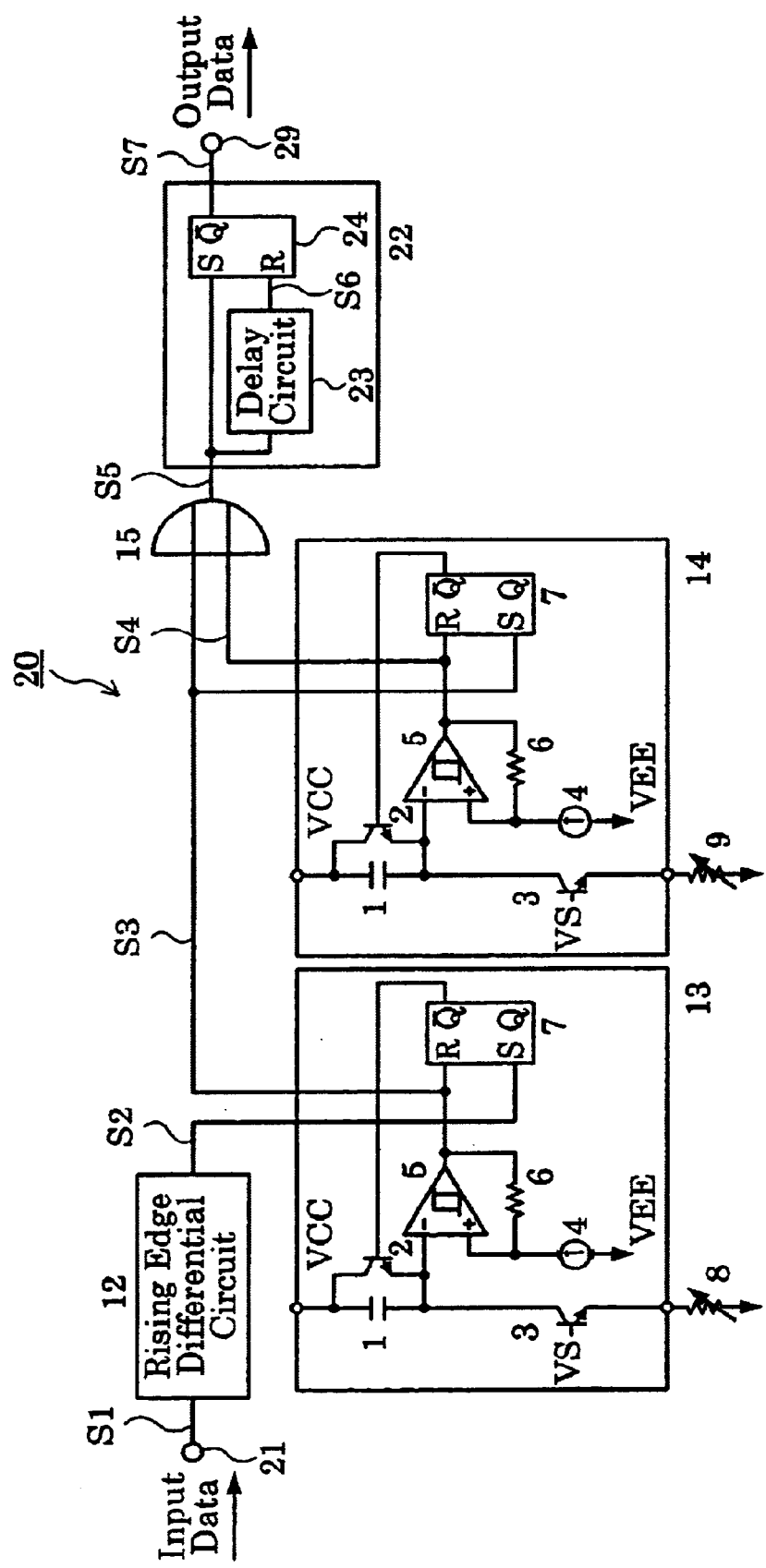
FIG. 3 is a circuit diagram of a clock extraction circuit according to the second embodiment of the invention.

FIG. 3 is a circuit diagram showing the configuration of a clock extraction circuit 20 according to the second embodiment of the invention. This clock extraction circuit 20 may be made up by adding an output pulse width varying means 22 to the non-linear extraction circuit 10 according to the first embodiment of the invention. The output pulse width varying means 22 includes a delay circuit 23 made up of a CR integrated circuit or the like, and an RS flip-flop circuit 24.

Figure 4:
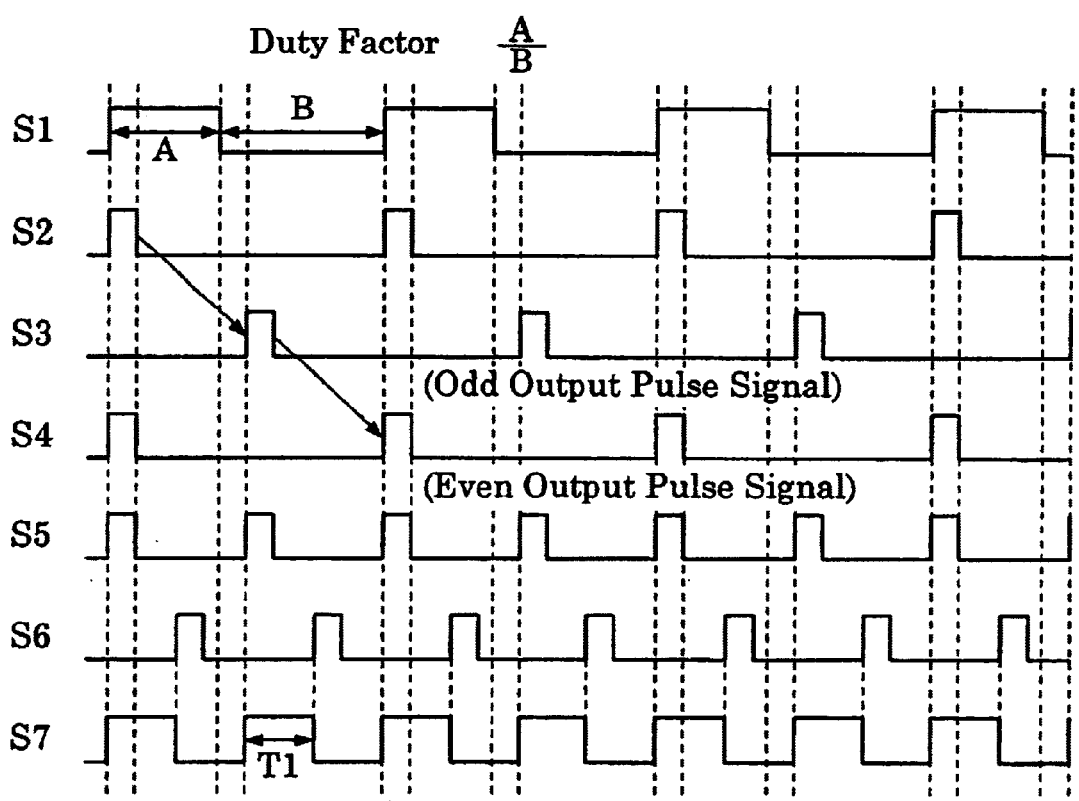
FIG. 4 is a timing chart for describing the operation of the clock extraction circuit as shown in FIG. 3.

FIG. 4 is a timing chart for describing the operation of the clock extraction circuit 20 according to the second embodiment of the invention. Signals S1 through S5 are generated by a circuit which is formed inside the clock extraction circuit 20 and is almost identical to the non-linear extraction circuit 10 according to the first embodiment of the invention. Characteristics of signals S1 through S5 in FIG. 4 are identical to those of the signals S1 through S5 in FIG. 2.

The output signal S5 from the OR gate 15 arranged in the clock extraction circuit 20 is inputted to the set pulse input terminal of the RS flip-flop circuit 24 belonging to the output pulse width varying means 22 and is also inputted to the delay circuit 23 belonging to the output pulse width varying means 22.

The delay circuit 23 is set such that the delay of time equivalent to the pulse width T1 of the output clock pulse S7 of which the duty factor is 50%, is given to the output signal S5 of the OR gate 15. In other words, the delay circuit 23 outputs the output signal S6 which is delayed by the time equivalent to ½ period of the output signal S5 from the OR gate 15. This output signal S6 is inputted to the reset pulse input terminal of the RS flip-flop circuit 24. Then, the RS flip-flop circuit 24 (i.e. the output pulse width varying means 22) outputs clock pulses S7 of which the duty factor is one to one (1:1).

With the clock extraction circuit 20 according to the current embodiment, should the duty factor A/B of the input data signal S1 be made worse, it would be made possible to extract stable timing components from the input data signal S1 without causing any displacement in the phase and to regenerate the clock pulse S7 of which the duty factor is 50%. With the regeneration of the clock pulse S7 of which the duty factor is 50%, the amplitude spectrum of the fundamental frequency component of the clock pulse signal for driving the timing filter (not shown) can be maximized, which is connected with the latter stage of the clock extraction circuit 20. Accordingly, the drop in the output level of the timing filter can be avoided, and the missing of clock and generation of clock jitter can be prevented. Furthermore, if the delay circuit 23 is made adjustable with regard to its delay amount, general application of the clock extraction circuit 20 will be made possible.

Figure 5:
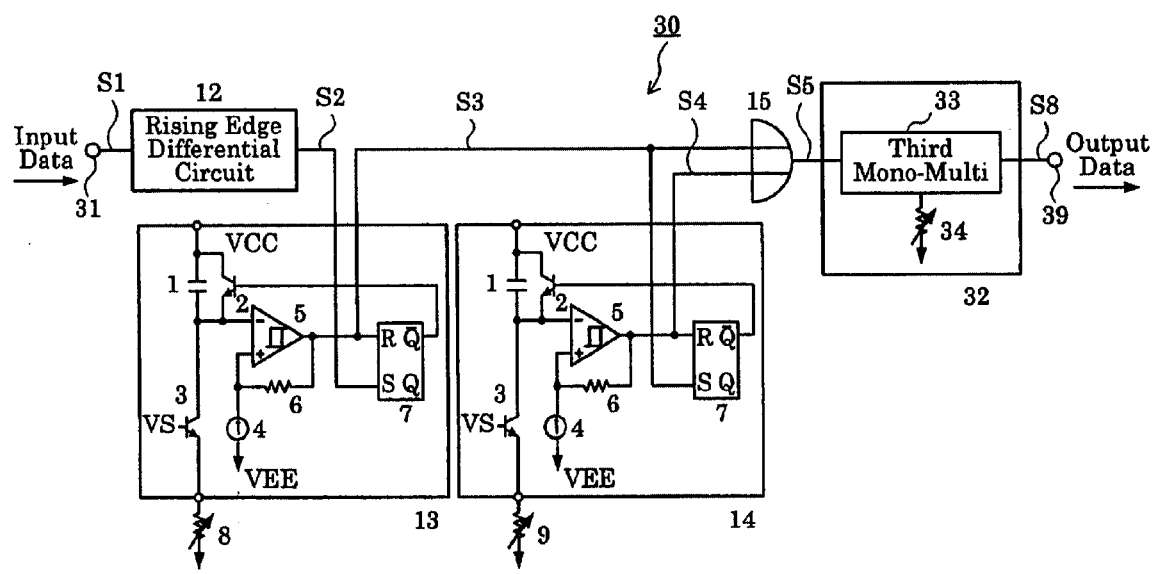
FIG. 5 is a circuit diagram of a clock extraction circuit according to the third embodiment of the invention.

FIG. 5 is a circuit diagram showing the configuration of a clock extraction circuit 30 according to the third embodiment of the invention. The clock extraction circuit 30 can be made up by replacing the output pulse width varying means 22 of the clock extraction circuit 20 with the output pulse width varying means 32 made up of the third Mono-Multi 33.

Figure 6:
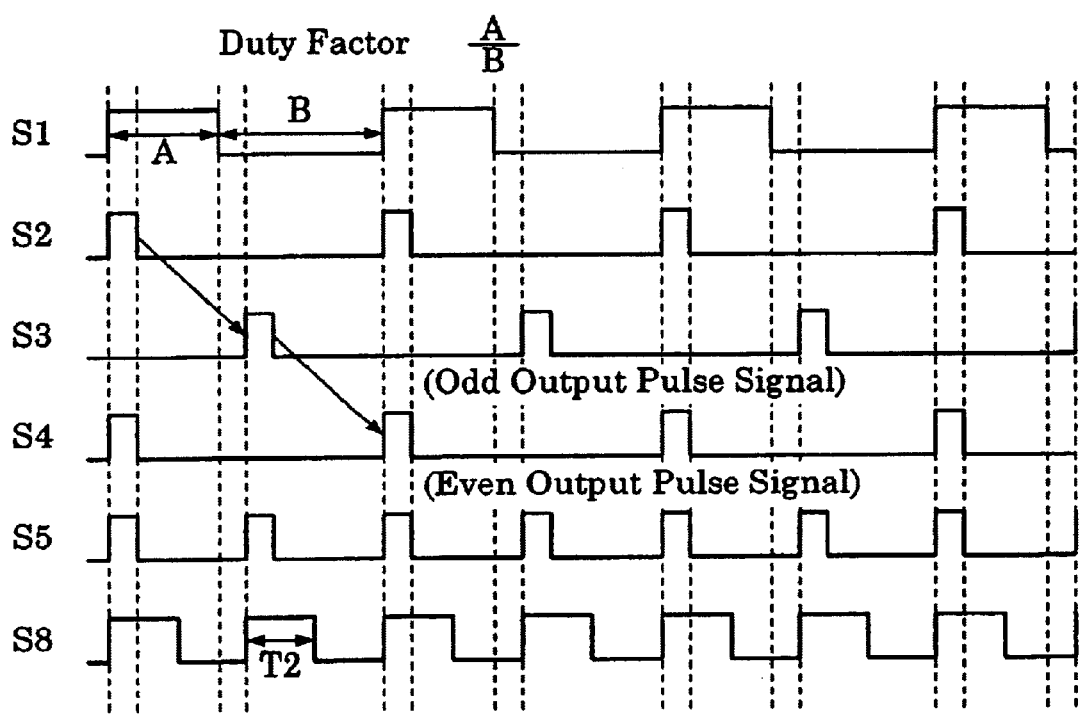
FIG. 6 is a timing chart for describing the operation of the clock extraction circuit as shown in FIG. 5.

FIG. 6 is a timing chart for describing the operation of the clock extraction circuit 30 according to the third embodiment of the invention. Signals S1 through S5 shown in FIG. 6 are generated by a circuit which is formed inside the clock extraction circuit 20 and is almost identical to the non-linear extraction circuit 10 according to the first embodiment of the invention. Characteristics of these signals are identical to those of the signals S1 through S5 in FIG. 2.

The output signal S5 from the OR gate 15 arranged in the clock extraction circuit 30 is inputted to the third Mono-Multi 33 belonging to the output pulse width varying means 32. The third Mono-Multi 33 generates the clock pulse S8 having a pulse width of T2 in synchronization with the output signal S5 from the OR gate 15 inputted thereto. The resistance value of an external variable resistor 34 connected to the third Mono-Multi 33 is set in advance such that the duty factor of the clock pulse S8 generated by the third Mono-Multi 33 is made 50%. Thus, the third Mono-Multi 33 (i.e. the output pulse width varying means 32) outputs the clock pulse S8 of which the duty factor is one to one (1:1).

The clock extraction circuit 30 according to the current embodiment can provide the same effect as the clock extraction circuit 20 according to the second embodiment of the invention. Furthermore, with the clock extraction circuit 30 according to the current embodiment, the pulse width T2 of the clock pulse S8 can be easily changed by adjusting the resistance value of the external variable resistor 34, so that it is made possible to output the clock pulse S8 which can be made use of in the wide range of application.

Figure 7:
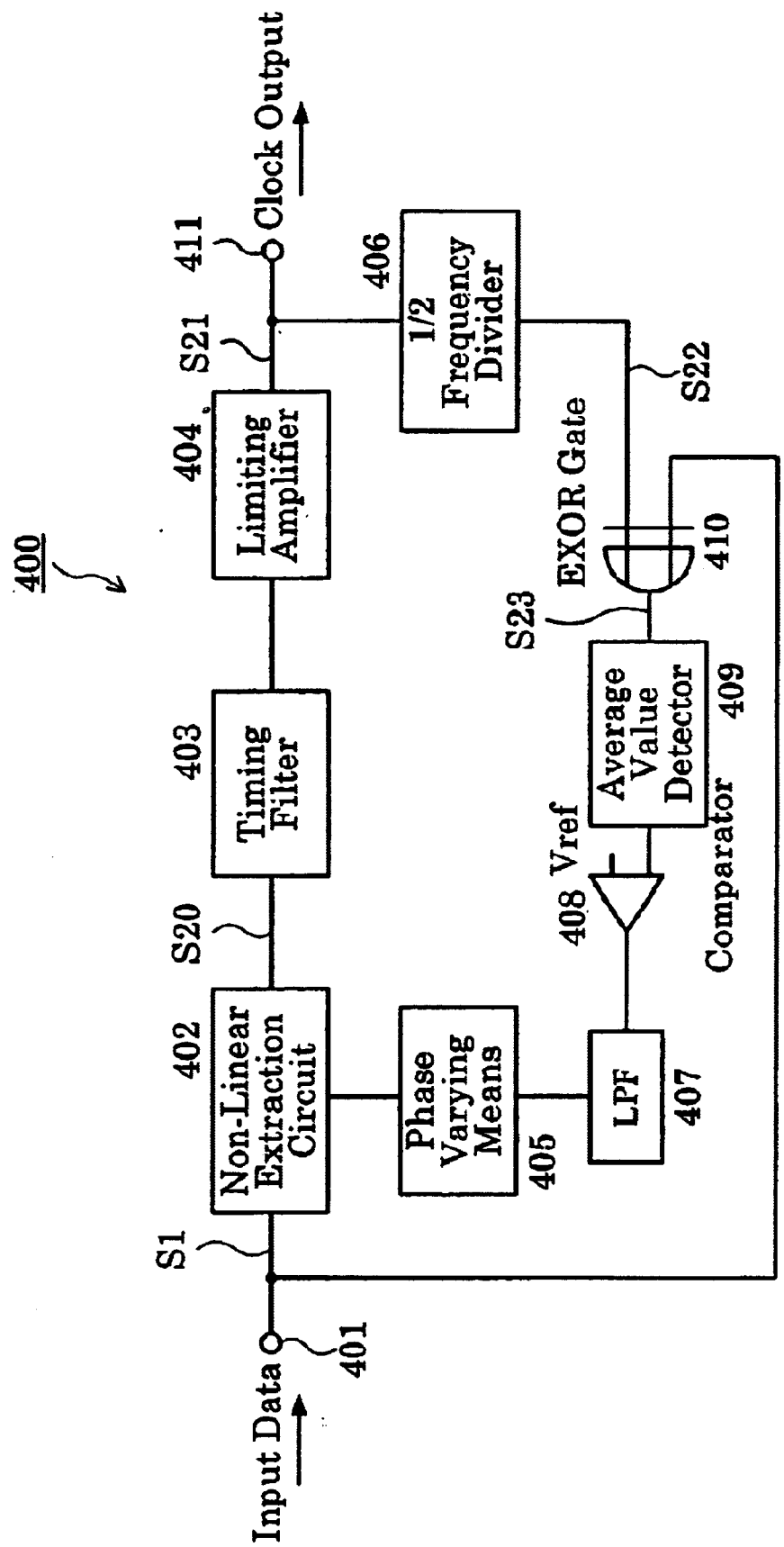
FIG. 7 is a circuit diagram of a clock extraction circuit according to the fourth embodiment of the invention.

FIG. 7 is a circuit diagram showing the configuration of a clock extraction circuit 400 according to the fourth embodiment of the invention.

The clock extraction circuit 400 is provided with an input terminal 401 for receiving an input data signal S1 and an output terminal 411 for outputting a clock output S21.

The clock extraction circuit 400 includes a non-linear extraction circuit 402 for extracting clock frequency components from the input data signal S1, a timing filter 403 for extracting only a fundamental frequency component from the extracted clock frequency components, a limiting amplifier 404 for converting a sinusoidal signal outputted from the timing filter 403 into a rectangular wave signal, a ½ frequency divider 406 for carrying out ½ frequency division with regard to a clock output S21 from the limiting amplifier 404, an EXOR gate 410 for carrying out the logical EXOR between the input data signal S1 and the Output signal S22 from the ½ frequency divider 406, an average value detector 409 which is connected with the output terminal of the EXOR gate 410 and is used for detecting the average value of the output signal from the EXOR gate 410, a comparator 408 for comparing the output voltage of the average value detector 409 with a reference voltage Vref, a low-pass filter (LPF) 407 which is connected with the comparator 408 and is used for removing the high frequency ripple component, and a phase varying means 405 which is connected with the low-pass filter (LPF) 407 and is used for controlling the phase of the output signal S20 from the non-linear extraction circuit 402.

The reference voltage Vref is determined as follows. At the time of initialization, the phase of the input data signal S1 and the phase of the output signal S22 from the ½ frequency divider 406 are compared with each other through the EXOR gate 410, and the average value detector 409 then outputs an average value voltage based on the result of the above comparison. The reference voltage Vref is determined as the average value voltage.

Figure 8:
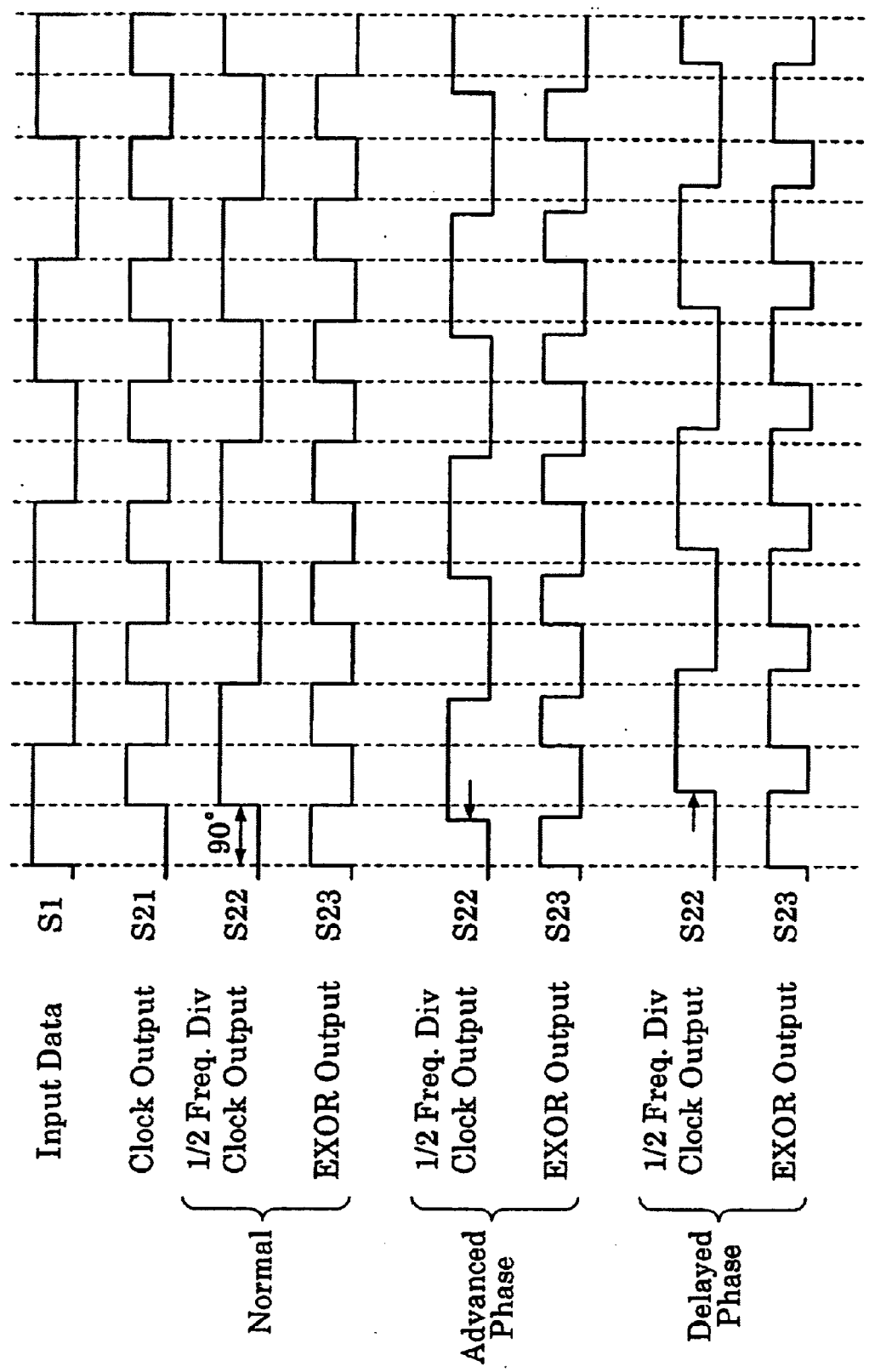
FIG. 8 is a timing chart for describing the operation of the clock extraction circuit as shown in FIG. 7.

FIG. 8 is a timing chart for describing the operation of the clock extraction circuit 400 according to the current embodiment of the invention.

In general, each timing of the input data signal S1 and the clock output S21 is identified by means of an identification and regeneration portion (not shown) which is connected with the latter stage of the clock extraction circuit 400. Therefore, each phase of the input data signal S1 and the clock output S21 is set such that, as shown in FIG. 8, the rising edge of the clock output S21 corresponds to the middle point between the rising and falling edges of the input data signal S1. Furthermore, for enabling the phase of the input data signal S1 to be compared with that of the clock output S21, the output signal S22 is formed by carrying out the ½ frequency division with respect to the clock output S21.

For instance, if the phase of the output clock S21 from the limiting amplifier 404 is varied to shift itself in the advancing direction due to the change of the operational environment such as change in humidity and temperature and others or the secular variation, the phase of the output signal S22 from the ½ frequency divider 406 will be varied to shift itself in the advancing direction, a wave form in this state being indicated as "½ frequency divided clock output S22 (advanced phase state)" in FIG. 8. Then, the pulse width of the output signal S23 from the EXOR gate 410 will be made narrower than that of "EXOR output S23 (ordinary phase state)," a wave form in this state being indicated as "EXOR output S23 (advanced phase state) in FIG. 8. Accordingly, the average voltage of the EXOR output S23 detected by the average value detector 409 is made lower than the reference voltage Vref.

On one hand, if the phase of the output clock S21 is varied to shift itself in the delaying direction, the phase of the output signal S22 from the ½ frequency divider 406 will be varied to shift itself in the delaying direction, a wave form in this state being indicated as "½ frequency divided clock output S22 (delayed phase state)" in FIG. 8. Then, the pulse width of the output signal S23 from the EXOR gate 410 will be made wider than that of "EXOR output S23 (ordinary phase state)," a wave form in this state is indicated as "EXOR output S23 (delayed phase state)" in FIG. 8. Accordingly, the average voltage of the EXOR output S23 detected by the average value detector 409 is made higher than the reference voltage Vref.

The comparator 408 compares the reference voltage Vref with the output voltage from the average value detector 409. When the output voltage from the average value detector 409 is lower than the reference voltage Vref (that is, when the phase of the clock output S21 is varied to shift itself in the advancing direction), the comparator 408 drops its output voltage. The phase varying means 405 receives the output voltage of the comparator 408 through the low-pass filter (LPF) 407 and controls the phase of the output signal S20 from the non-linear extraction circuit 402 so as to shift it in the delaying direction, taking account of the falling degree of the output voltage from the comparator 408. By controlling the phase of the output signal S20 in the delaying direction, the phase of the clock output S21 varying in the advancing direction is adversely adjusted to be shifted in the delaying direction. When the phase of the clock output S21 has come back to the normal phase, the output voltage from the average value detector 409 is made equal to the reference voltage Vref, and the phase of the clock output S21 is then fixed.

On one hand, when the output voltage from the average value detector 409 is higher than the reference voltage Vref (that is, when the phase of the clock output S21 is varied to shift itself in the delaying direction), the comparator 408 raises its output voltage. The phase varying means 405 receives the output voltage of the comparator 408 through the low-pass filter (LPF) 407 and controls the phase of the output signal S20 from the non-linear extraction circuit 402 to shift it in the advancing direction, taking account of the rising degree of the output voltage from the comparator 408. By controlling the phase of the output signal S20 in the advancing direction, the phase of the clock output S21 varying in the delaying direction is adversely adjusted to be shifted in the advancing direction. When the phase of the clock output S21 has come back to the normal phase, the output voltage from the average value detector 409 is made equal to the reference voltage Vref, and the phase of the clock output S21 is then fixed.

In this way, the phase relation between the input data signal S1 and the clock output S21 can be always kept constant even if change in the operational environment or the secular variation takes place.

The low-pass filter (LPF) 407 is used for removing the high frequency, ripple component from the output signal of the comparator 408.

As has been described above, according to the clock extraction circuit 400 of the current embodiment, the phase of the output signal S20 from the non-linear extraction circuit 402 is controlled by the phase varying means 405. Thus, even if the phase of the clock output S21 is varied, for instance, due to the secular variation caused in the non-linear extraction circuit 402, the timing filter 403, and/or the limiting amplifier 404, all of which belong to the clock extraction circuit 400, the phase variation can be suppressed as mentioned above, thereby enabling the stable clock output S21 to be supplied to the other circuit.

Figure 9:
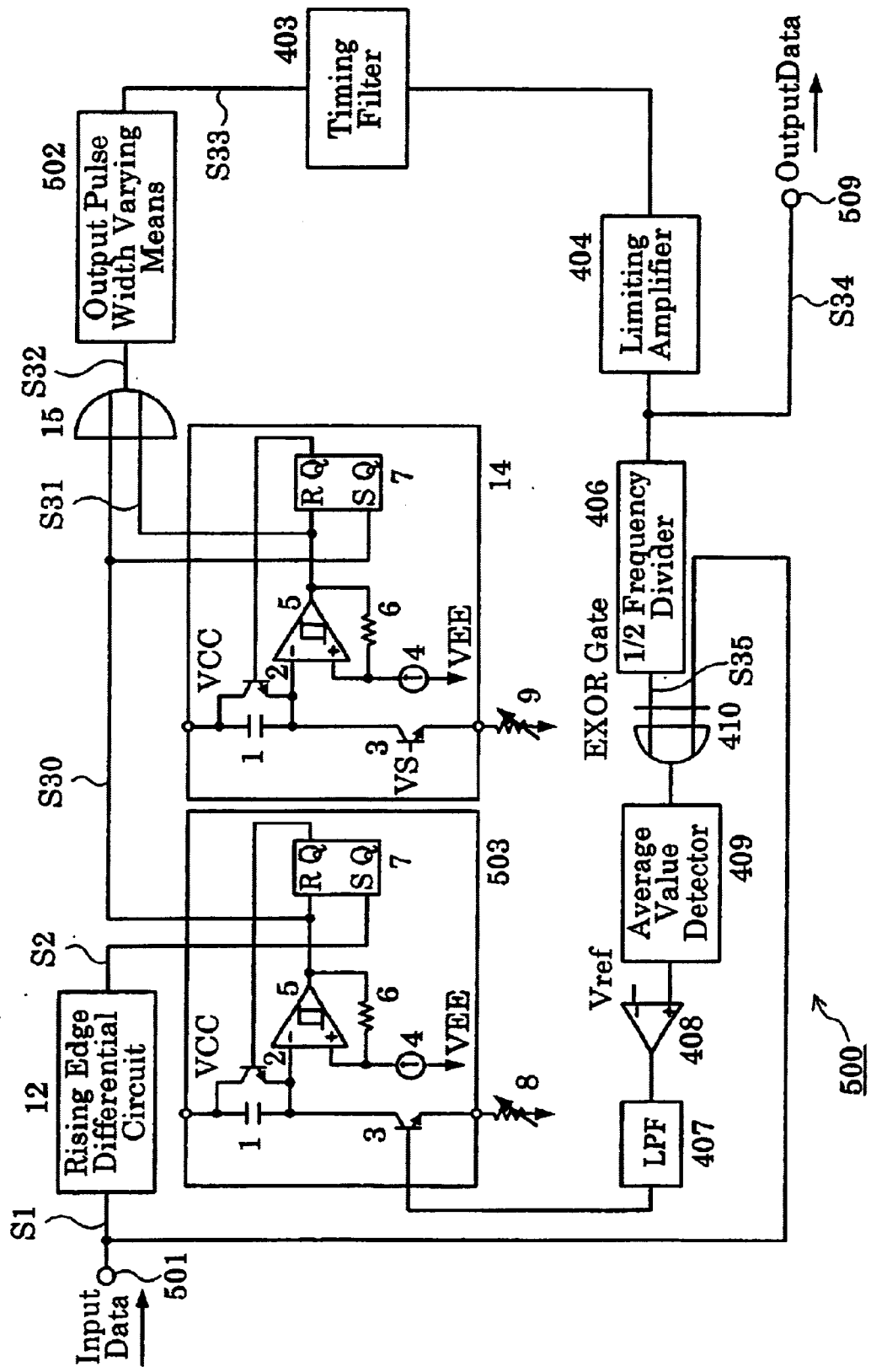
FIG. 9 is a circuit diagram of a clock extraction circuit according to the fifth embodiment of the invention.

FIG. 9 is a circuit diagram showing the configuration of a clock extraction circuit 500 according to the fifth embodiment of the invention.

The clock extraction circuit 500 is provided with an input terminal 501 for receiving an input data signal S1 and a clock output terminal 509 for outputting a clock output S34.

The clock extraction circuit 500 includes a rising edge differential circuit 12 which is made up of a differential amplifier or the like and generates a differential pulse at the rising edge of the input data signal S1, a first Mono-Multi 503 connected to the rising edge differential amplifier 12, a second Mono-Multi 14 connected with the first Mono-Multi 503, an OR gate 15 for carrying out the logical OR between the output signal S30 from the first Mono-Multi 503 and the output signal S31 from the second Mono-Multi 14, an output pulse width varying means 502 which is connected with the OR gate 15 and is made up of the Mono-Multi or others, a timing filter 403 which is connected with the output pulse width varying means 502 and is made up of an SAW filter or the like, a limiting amplifier 404 which is connected with the timing filter 403 and is made up of the differential amplifier or the like, a ½ frequency divider 406 connected with the limiting amplifier 404, an EXOR gate 410 for carrying out the logical EXOR between the input data signal S1 and the output signal S3 from the ½ frequency divider 406, an average value detector 409 connected with the EXOR gate 410, a comparator 408 for comparing the output voltage of the average value detector 409 with the reference voltage Vref, and a low-pass filter (LPF) 407 which is connected with the comparator 408 and supplies its output to the base of a transistor 3 belonging to the first Mono-Multi 503.

The operation of the clock extraction circuit 500 will now be described with reference to the timing chart as shown in FIG. 6.

Signals S1 through S5 indicated in FIG. 9 are generated by means of a circuit approximately identical to the non-linear extraction circuit 30 according to the third embodiment, which is made up inside the clock extraction circuit 500. Still further, signals S1, S2, S30, S31, S32, and S33 as shown in FIG. 9 correspond to signals S1, S2, S3, S4, S5, and S8 as shown in FIGS. 5 and 6, respectively.

The output pulse 32 of the OR gate 15 is inputted to the output pulse width varying means 502 which, in turn, outputs the timing pulse S33 with the duty factor of one to one (1:1).

Then, only the fundamental frequency component is extracted from the timing pulse S33 by means of the timing filter 403. The extracted sinusoidal signal is converted into a rectangular signal by means of the limiting amplifier 404 and then, the rectangular signal is outputted as a clock output S34.

Furthermore, the frequency division by the ½ frequency divider 406 is carried out with respect to the rectangular signal S34. The EXOR gate 410 carries out the logical EXOR between the input data signal S1 and the output signal S35 from the ½ frequency divider 406. Based on the result of the logical EXOR, the average value detector 409 can determine the average value of the output signal from the EXOR gate 410.

Each operation of the EXOR gate. 410, the average value detector 409, the comparator 408, and the low-pass filter (LPF) 407, all of which are arranged in the clock extraction circuit 500 according to the current embodiment, is almost identical to each operation of the EXOR gate 410, the average value detector 409, the comparator 408, and the low-pass filter (LPF) 407, all of which are arranged in the clock extraction circuit 400 according to the fourth embodiment as described previously. When the output voltage from the average value detector 409 is lower than the reference voltage Vref (that is, when the phase of the clock output S34 is varied to shift itself in the advancing direction), the comparator 408 drops its output voltage. At this stage, since the output voltage of the comparator 408 is applied to the base of the transistor 3 arranged in the first Mono-Multi 503 through the low-pass filter (LPF) 407, the base current of the transistor 3 is decreased corresponding to the dropped output voltage of the comparator 408, thus the emitter current being also decreased correspondingly. When the emitter current of the transistor 3 is decreased, the phase of the reset pulse output S30 of the first Mono-Multi 503 is varied to shift itself in the delaying direction. With this phase shift in the delaying direction of the reset pulse output S30, the phase of the clock output S34 which is varied to shift itself in the advancing direction, is adjusted to shift itself in the delaying direction. When the phase of the clock output S34 has come back to the normal phase, the output voltage from the average value detector 409 is made equal to the reference voltage Vref, and the phase of the clock output S34 is the fixed.

On one hand, when the output voltage from the average value detector 409 is higher than the reference voltage Vref (that is, when the phase of the clock output S34 is varied to shift itself in the delaying direction), the comparator 408 raises its output voltage. At this stage, since the output voltage of the comparator 408 is applied to the base of the transistor 3 arranged in the first Mono-Multi 503 through the low-pass filter (LPF) 407, the base current of the transistor 3 is increased corresponding to the raised output voltage of the comparator 408, thus the emitter current being also increased correspondingly. When the emitter current of the transistor 3 is increased, the phase of the reset pulse output S30 of the first Mono-Multi 503 is varied to shift itself in the advancing direction. With this phase shift in the advancing direction of the reset pulse output S30, the phase of the clock output S34 which is varied to shift itself in the delaying direction, is adjusted to shift itself in the advancing direction. When the phase of the clock output S34 has come back to the normal phase, the output voltage from the average value detector 409 is made equal to the reference voltage Vref, and the phase of the clock output S34 is then fixed.

As described in the above, since the base current of the transistor 3 arranged in the first Mono-Multi 503 is controlled, the phase relation between the input data signal S1 and the clock output S34 can be always kept constant even if change in the operational environment takes place.

The clock extraction circuit 500 according to the current embodiment may provide the same effect as the clock extraction circuit 30 according to the third embodiment. Moreover, since the base current of the transistor 3 arranged in the first Mono-Multi 503 is controlled and the phase of the clock output S34 is adjusted, there can be obtained the same effect as is provided by the clock extraction circuit 400 according to the fourth embodiment.

Figure 10:
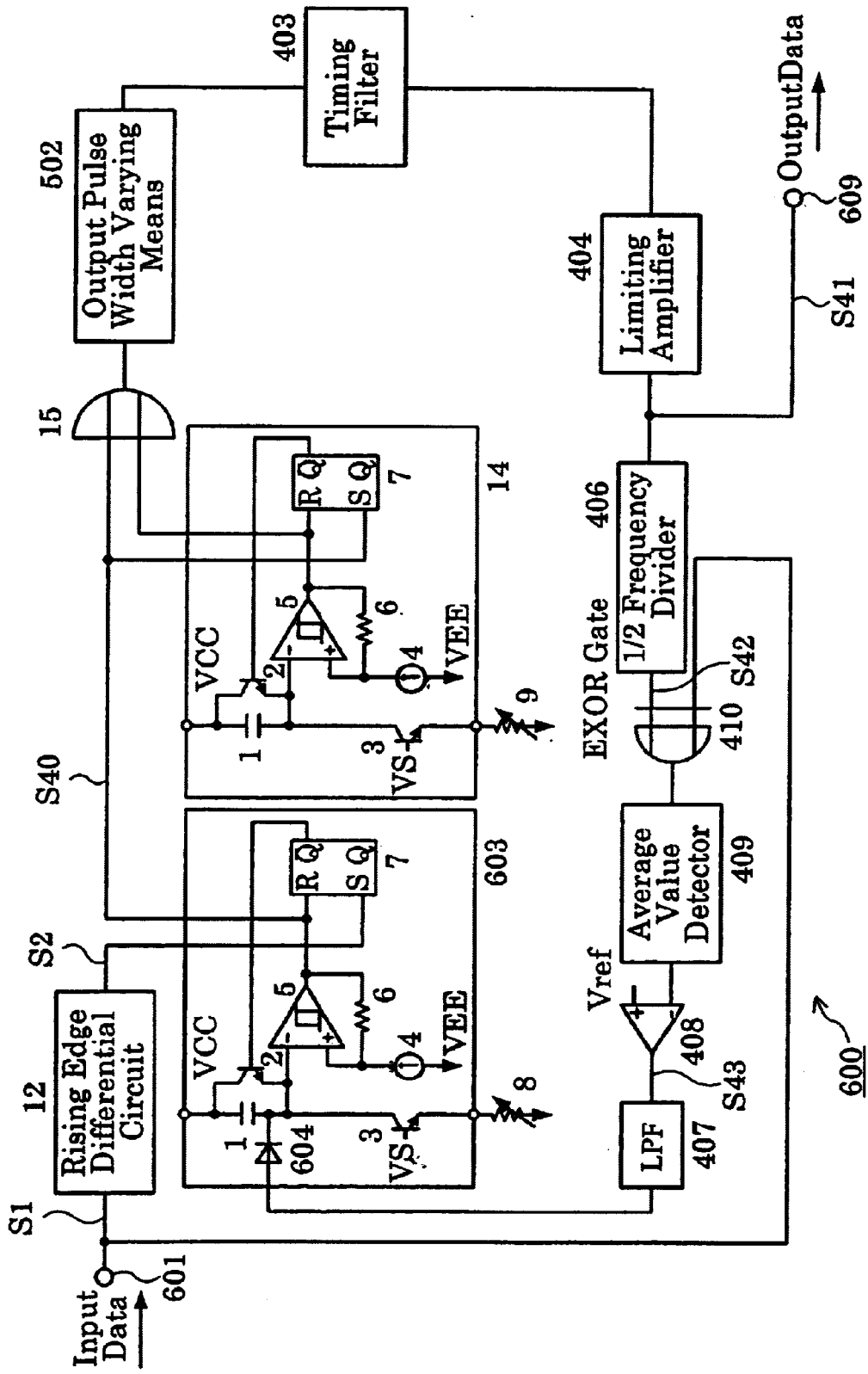
FIG. 10 is a circuit diagram of a clock extraction circuit according to the sixth embodiment of the invention.

FIG. 10 is a circuit diagram showing the configuration of a clock extraction circuit 600 according to the sixth embodiment of the invention.

The clock extraction circuit 600 is provided with an input terminal 601 for receiving an input data signal S1 and a clock output terminal 609 for outputting a clock output SH.

The clock extraction circuit 600 has a configuration in which the first Mono-Multi 503 of the clock extraction circuit 500 according to the fifth embodiment is replaced by the first Mono-Multi 603. In this clock extraction circuit 600, the output terminal of the low-pass filter (LPF) 407 is connected with the anode of a variable capacitance diode 604 arranged in the first Mono-Multi 604. The cathode of the variable capacitance diode 604 is connected with the collector of a transistor 3. In the clock extraction circuit 500 as discussed previously, the reference voltage Vref was applied to the minus (−) input terminal of the comparator 408 while the output voltage of the average value detector 409 was applied to the plus (+) input terminal of the same. In the clock extraction circuit 600, however, the reference voltage Vref is applied to the plus (+) input terminal of the comparator 408 while the output voltage of the average value detector 409 is applied to the minus (−) input terminal of the comparator 408.

The operation of the clock extraction circuit 600 according to the sixth embodiment and that of the clock extraction circuit 500 according to the fifth embodiment are almost identical to each other except the way of adjusting the respective time constants of the first Mono-Multis 503 and 603. The output signal S43 of the comparator 408 is inputted, after removing its high frequency ripple component by the low-pass filter (LPF) 407, to the anode of the variable capacitance diode 604 arranged in the first Mono-Multi 603. The variable capacitance diode 604 controls the discharge time of a capacitor 1 which sets the phase of the reset pulse output S40 outputted from the first Mono-Multi 603.

The capacitance value of the variable capacitance diode 604 is increased when the forward bias is applied thereto while it is decreased when the backward bias is applied thereto. The variable capacitance diode 604 forms a combined capacitance together with the capacitor 1, and with this combined capacitance, the time constant of the first Mono-Multi 603 is determined.

The clock extraction circuit 600 according to the sixth embodiment controls the phase of the clock output S41 as follows, in the similar way that the clock extraction circuit 500 according to the fifth embodiment does. When the output voltage from the average value detector 409 is lower than the reference voltage Vref (that is, when the phase of the clock output S41 is varied to shift itself in the advancing direction), the comparator 408 raises its output voltage. With the raised output voltage of the comparator 408, the anode potential of the variable capacitance diode 604 arranged in the first Mono-Multi 603 is increased, thereby the value of the capacitance combined with the capacitor 1 being increased. With the increase in the combined capacitance value, the phase of the reset pulse output S40 of the first Mono-Multi 603 is shifted in the delaying direction. With this phase shift in the delay direction of the reset pulse output S40, the phase of the clock output S41 varying in the advancing direction is adjusted to shift itself in the delaying direction. When the phase of the clock output S41 has come back to the normal phase, the output voltage from the average value detector 409 is made equal to the reference voltage Vref, and the phase of the clock output S41 is then fixed.

On one hand, when the output voltage from the average value detector 409 is higher than the reference voltage Vref (that is, when the phase of the clock output S41 is varied to shift itself in the delaying direction), the comparator 408 drops its output voltage. With the dropped output voltage of the comparator 408, the anode potential of the variable capacitance diode 604 arranged in the first Mono-Multi 603 is decreased, thereby the value of the capacitance combined with the capacitor 1 being decreased. With this decrease in the combined capacitance value, the phase of the reset pulse output S40 is shifted in the advancing direction. With this phase shift in the advancing direction of the reset pulse output S40, the phase of the clock output S41 varying in the delaying direction is adjusted to shift itself in the advancing direction. When the phase of the clock output S41 has come back to the normal phase, the output voltage from the average value detector 409 is made equal to the reference voltage Vref, and the phase of the clock output S41 is then fixed.

As described in the above, since the capacitance value of the variable capacitance diode 604 arranged in the first Mono-Multi 603 is controlled, the phase relation between the input data signal S1 and the clock output S41 can be always kept constant even if a certain change takes place in the operational environment.

The clock extraction circuit 600 according to the current embodiment may provide the same effect as the clock extraction circuit 500 according to the fifth embodiment. Moreover, since the clock extraction circuit 600 is made up such that the phase of the clock output S41 is adjusted by controlling the capacitance value of the variable capacitance diode 604 arranged in the first Mono-Multi 603, the current flowing through the transistor 3 as a constant current source can be kept constant. Accordingly, it is made possible to provide a more stabilized clock extraction operation without inviting deterioration in the current amplification factor of the transistor 3, which is observed when the base current is small or insufficient.

Figure 11:
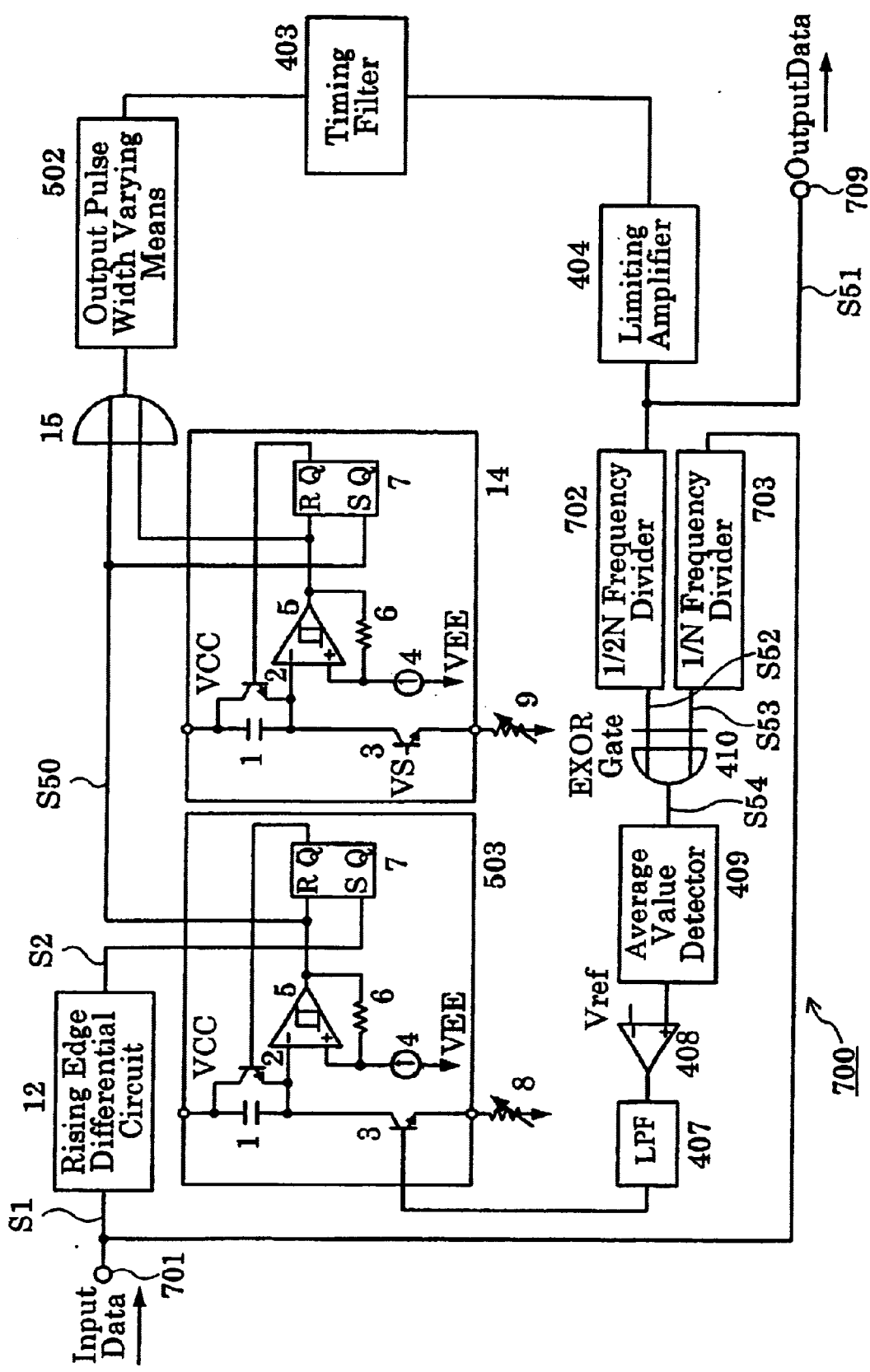
FIG. 11 is a circuit diagram of a clock extraction circuit according to the seventh embodiment of the invention.

FIG. 11 is a circuit diagram showing the configuration of a clock extraction circuit 700 according to the seventh embodiment of the invention.

The clock extraction circuit 700 is provided with an input terminal for receiving an input data signal S1 and a clock output terminal 709 for outputting a clock output S51.

The clock extraction circuit 700 can be made up based on the clock extraction circuit 500 according to the fifth embodiment as follows. At first, the ½ frequency divider 406 arranged between the limiting amplifier 404 and the EXOR gate 410 in the clock extraction 500, is replaced by a 1/(2N) frequency divider 702. Furthermore, there is newly added a 1/N frequency divider 703 for carrying out the 1/N frequency division with respect to the input data signal S1 and supplying the result of the frequency division to the EXOR gate 410. The 1/(2N) frequency divider 702 carries out the 1/(2N) frequency division with respect to the clock output S51 from the limiting amplifier 404 and supplies the result of this frequency division to the EXOR gate 410. The 1/N frequency divider 703 carries out the 1/N frequency division with respect to the input data signal S1 and supplies the result of the frequency division to the EXOR gate 410. Here, "N" indicates a natural number.

The operation of the clock extraction circuit 700 according to the seventh embodiment is almost identical to that of the clock extraction circuit 500 according to the fifth embodiment except the way of the frequency division with respect to the signal inputted to the EXOR gate 410.

The EXOR gate 410 carries out the logical EXOR between the output signal S53 from the 1/N frequency divider 703 and the output signal S52 from the 1/(2N) frequency divider 702, and outputs the output signal S54 obtained by the logical EXOR. The average value detector 409 detects the average value of the output signal S54 from the EXOR gate 410.

Each operation of the EXOR gate 410, the average value detector 409, the comparator 408, and the low-pass filter (LPF) 407, all of which are arranged in the clock circuit 700 according to the current embodiment, is almost identical to that of the EXOR gate 410, the average value detector 409, the comparator 408, and the low-pass filter (LPF) 407, all of which are arranged in the clock circuit 500 according to the fifth embodiment. When the output voltage from the average value detector 409 is lower than the reference voltage Vref (that is, when the phase of the clock output S51 is varied to shift itself in the advancing direction), the comparator 408 drops its output voltage. At this stage, since the output voltage of the comparator 408 is applied to the base of the transistor 3 arranged in the first Mono-Multi 503 through the low-pass filter (LPF) 407, the base current of the transistor 3 is decreased corresponding to the dropped output voltage of the comparator 408, thus the emitter current being also decreased correspondingly. When the emitter current of the transistor 3 is decreased, the phase of the reset pulse output S50 from the first Mono-Multi 503 is varied to shift itself in the delaying direction. With this phase shift in the delaying direction of the reset pulse output S50, the phase of the clock output S51 varying to shift itself in the advancing direction, is adjusted to shift itself in the delaying direction. When the phase of the clock output S51 has come back to the normal phase, the output voltage from the average value detector 409 is made equal to the reference voltage Vref, and the phase of the clock output S51 is then fixed.

On one hand, when the output voltage from the average value detector 409 is higher than the reference voltage Vref (that is, when the phase of the clock output S51 is varied to shift itself in the delaying direction), the comparator 408 raises its output voltage. At this stage, since the output voltage of the comparator 408 is applied to the base of the transistor 3 arranged in the first Mono-Multi 503 through the low-pass filter (LPF) 407, the base current of the transistor 3 is increased corresponding to the raised output voltage of the comparator 408, thus the emitter current being also increased correspondingly. When the emitter current of the transistor 3 is increased, the phase of the reset pulse output S50 from the first Mono-Multi 503 is varied to shift itself in the advancing direction. With this phase shift in the advancing direction of the reset pulse output S50, the phase of the clock output S51 varying to shift itself in the delaying direction, is adjusted to shift itself in the advancing direction. When the phase of the clock output S51 has come back to the normal phase, the output voltage from the average value detector 409 is made equal to the reference voltage Vref, and the phase of the clock output S51 is then fixed.

As described in the above, since the base current of the transistor 3 arranged in the first Mono-Multi 503 is controlled, the phase relation between the input data signal S1 and the clock output S51 can be always kept constant even if a certain change takes place in the operational environment.

The clock extraction circuit 700 according to the current embodiment may provide the same effect as the clock extraction circuit 500 according to the fifth embodiment. Moreover, as the clock extraction circuit 700 is made up such that the phase of output signal S53 of the 1/N frequency divider 703 is compared with the phase of output signal S52 of the 1/(2N) frequency divider 702 by means of the EXOR gate 410, it is made possible to operate the internal circuit at a low speed. As the result of this, there is realized advantageous reduction in the power consumption by the clock extraction circuit.

Figure 12:
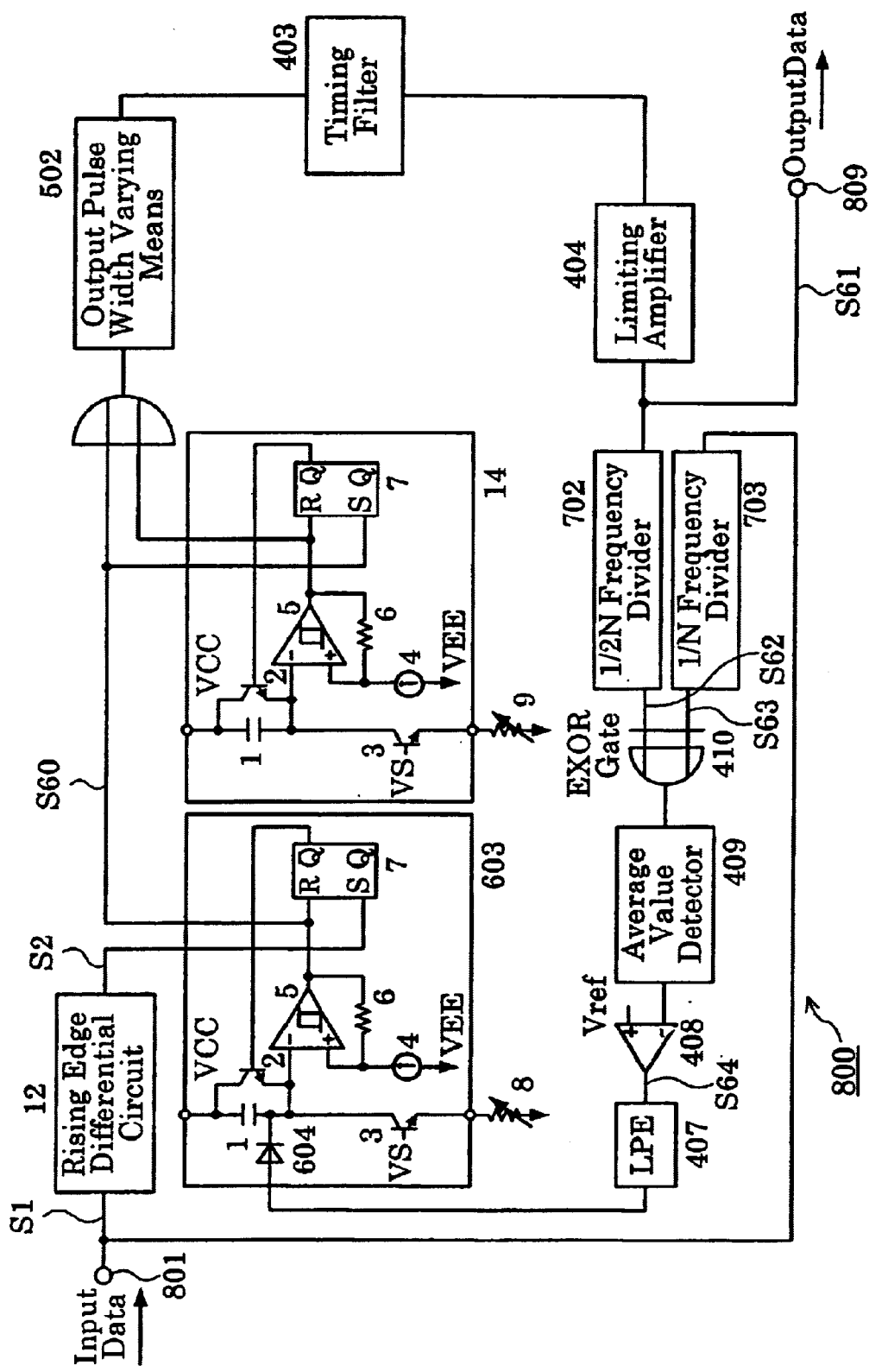
FIG. 12 is a circuit diagram of a clock extraction circuit according to the eighth embodiment of the invention.
Figure 13:
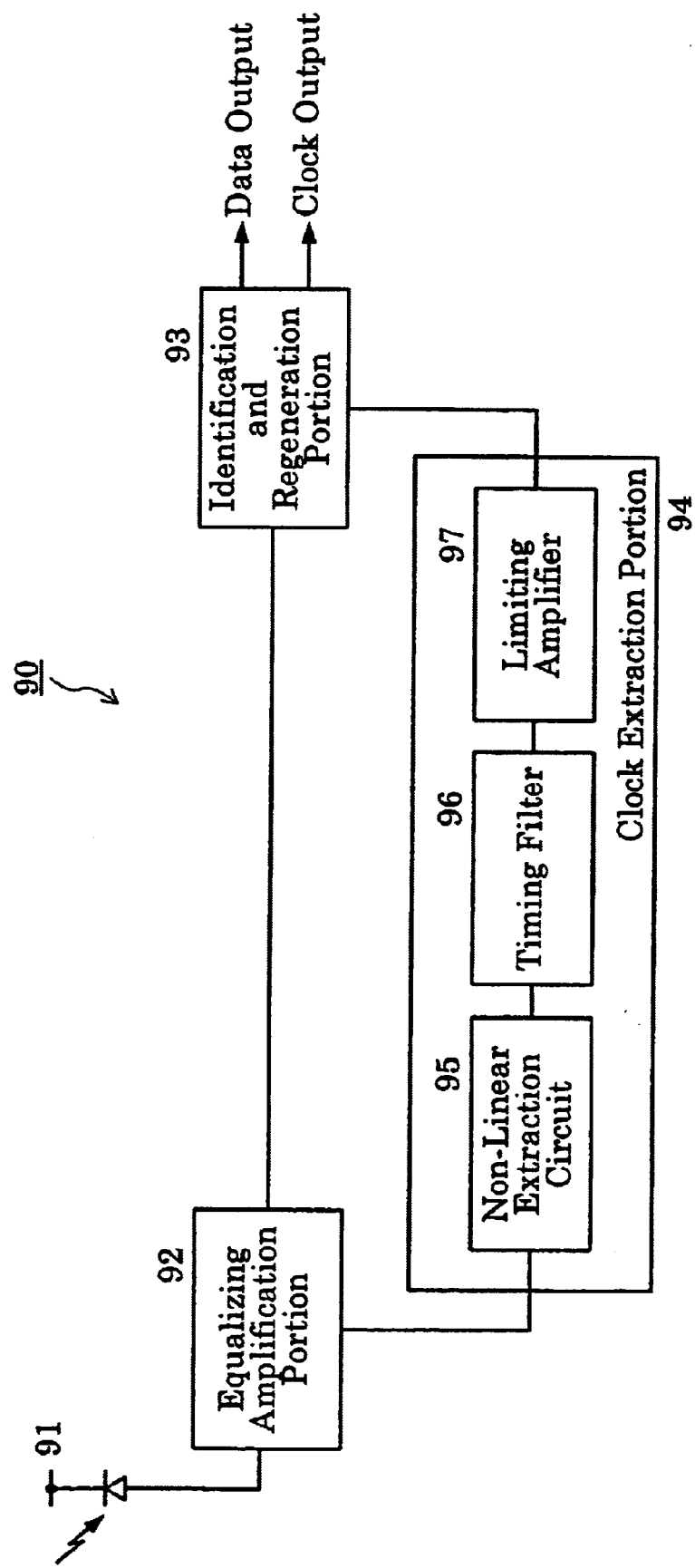
FIG. 13 is a block diagram illustrating the configuration of an optical signal receiver.
Figure 14:
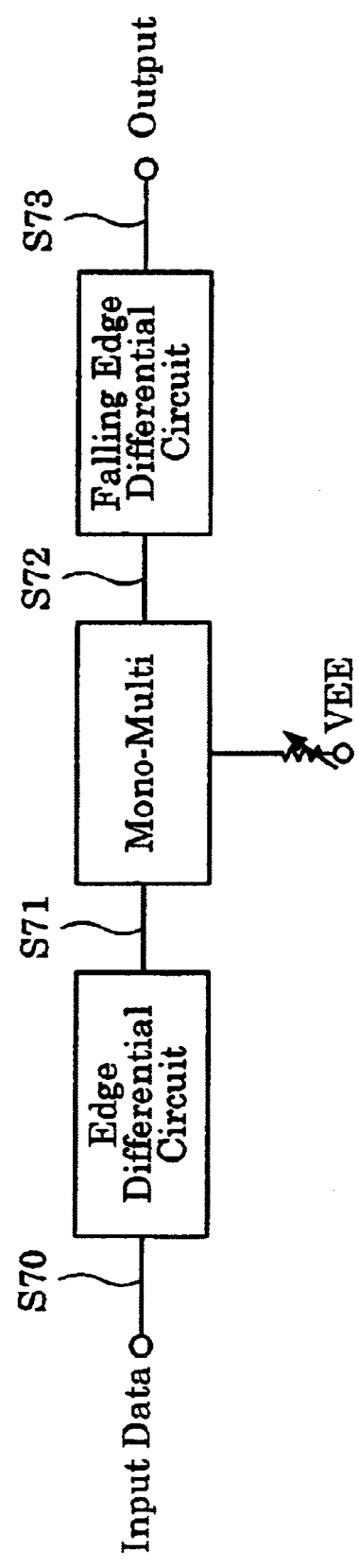
FIG. 14 is a block diagram showing the configuration of a prior art non-linear extraction circuit.
Figure 15:
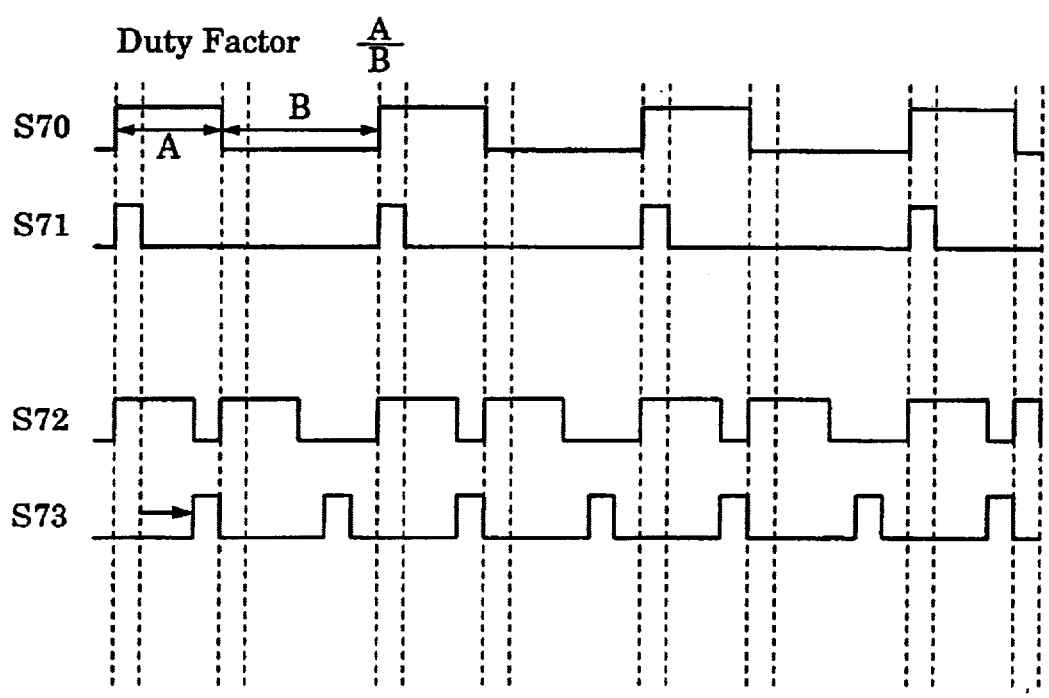
FIG. 15 is a timing chart indicating the operation of a prior art non-linear extraction circuit.

FIG. 12 is a circuit diagram showing the configuration of a clock extraction circuit 800 according to the eighth embodiment of the invention.

The clock extraction circuit 800 is provided with an input terminal 801 for receiving an input data signal S1 and a clock output terminal 809 for outputting a clock output S61. The clock extraction circuit 800 can be made up by replacing the first Mono-Multi 503 of the clock extraction circuit 700 according to the seventh embodiment of the invention by the Mono-Multi 603. In the clock extraction circuit 800, the output terminal of the low-pass filter (LPF) 407 is connected with the anode of a variable capacitance diode 604 arranged in the first mono-multi vibrator 603, and the cathode of a variable capacitance diode 604 is connected with the collector of the transistor 3. In the clock extraction circuit 700 as discussed previously, the reference voltage Vref was applied to the minus (−) input terminal of the comparator 408 while the output voltage of the average value detector 409 was applied to the plus (+) input terminal of the same. In the clock extraction circuit 800, however, the reference voltage Vref is applied to the plus (+) input terminal of the comparator 408 while the output voltage of the average value detector 409 is applied to the minus (−) input terminal of the same.

The operation of the clock extraction circuit 800 according to the eighth embodiment is almost identical to that of the clock extraction circuit 700 according to the seventh embodiment except the way of adjusting the respective time constants of the first Mono-Multis 503 and 603.

The output signal S43 of the comparator 408 is inputted, after removing its high frequency ripple component by the low-pass filter (LPF) 407, to the anode of the variable capacitance diode 604 arranged in the first Mono-Multi 603. This variable capacitance diode 604 controls the discharge time of a capacitor 1 which sets the phase of the reset pulse output S60 outputted from the first Mono-Multi 603.

The clock extraction circuit 800 according to the eighth embodiment controls the phase of the clock output S61 as follows, in the similar way that the clock extraction circuit 600 according to the sixth embodiment does. When the output voltage from the average value detector 409 is lower than the reference voltage Vref (that is, when the phase of the clock output S61 is varied to shift itself in the advancing direction), the comparator 408 raises its output voltage. With this raised output voltage, the anode potential of the variable capacitance diode 604 arranged in the first Mono-Multi 603 is increased, thereby the value of the capacitance combined with the capacitor 1 being increased. With this increase in the combined capacitance value, the phase of the reset pulse output S60 of the first mono-multi 603 is shifted in the delaying direction. With this phase shift in the delay direction of the reset pulse output S60, the phase of the clock output S61 varying in the advancing direction is adjusted to shift itself in the delaying direction. When the phase of the clock output S61 has come back to the normal phase, the output voltage from the average value detector 409 is made equal to the reference voltage Vref, and the phase of the clock output S61 is then fixed.

On one hand, when the output voltage from the average value detector 409 is higher than the reference voltage Vref (that is, when the phase of the clock output S61 is varied to shift itself in the delaying direction), the comparator 408 drops its output voltage. With this dropped the output voltage, the anode potential of the variable capacitance diode 604 arranged in the first Mono-Multi 603 is decreased, thereby the value of the capacitance combined with the capacitor 1 being decreased. With this decrease in the combined capacitance value, the phase of the reset pulse output S60 of the first Mono-Multi 603 is varied to shift itself in the advancing direction. With this phase shift in the advancing direction of the reset pulse output S60, the phase of the clock output S61 varying in the delaying direction is adjusted to shift itself in the advancing direction. When the phase of the clock output S61 has come back to the normal phase, the output voltage from the average value detector 409 is made equal to the reference voltage Vref, and the phase of the clock output S61 is then fixed.

As described in the above, since the capacitance value of the variable capacitance diode 604 arranged in the first Mono-Multi 603 is controlled, the phase relation between the input data signal S1 and the clock output S61 can be always kept constant even if a certain change takes place in the operational environment.

The clock extraction circuit 800 according to the current embodiment may provide the same effect as the clock extraction circuit 600 according to the sixth embodiment. Moreover, as the clock extraction circuit 800 is made up such that the phase of the clock output S61 is adjusted by controlling the capacitance value of the variable capacitance diode 604 arranged in the first Mono-Multi 603, the current flowing through the transistor 3 as a constant current source can be kept constant. Accordingly, it is made possible to provide a more stabilized clock extraction operation without inviting deterioration in the current amplification factor of the transistor 3 which is observed when the base current is small or insufficient. In addition, the clock extraction circuit 800 is made up, in the similar way that the clock extraction circuit 700 is, such that the output signal S63 of the 1/N frequency divider 703 and the output signal S62 of the 1/(2N) frequency divider 702 are compared with each other by means of the EXOR gate 410, so that it becomes possible to operate the internal circuit at a low speed. As the result of this, there is realized advantageous reduction in the power consumption by the clock extraction circuit.

While preferred embodiments of the invention have been described with reference to the accompanying drawings, it will be apparent that the invention is not limited to these preferred embodiments and that those skilled in the art may make variations and modifications without departing from the principle and spirit of the invention, the scope of which is defined in the appended claims, and it is understood that such variations and modifications belong to the technical range of the invention. For instance, the rising edge differential circuit has been used for describing the preferred embodiments of the invention, but it is possible to replace the rising edge differential circuit by the falling edge differential circuit without any change of the effects obtained by the former.

The invention has been discussed so far by way of examples of several preferred embodiments according thereto, in which the invention is applied to the clock extraction portion of an optical signal receiver. However, the invention is not limited to such examples and has a wide range of application. For instance, the invention is applicable to a multiplier circuit for multiplying the pulse frequency component, a clock frequency converting circuit for performing the frequency conversion from the low speed clock to the high speed clock, and so forth.

According to the invention, the repetition period of each pulse of the clock frequency component to be extracted is made constant by means of the Mono-Multi circuit, so that the stable clock can be extracted even from the input data of which the duty factor is made worse.

Furthermore, the phase of the output signal from the non-linear extraction circuit is controlled by the phase varying means, so that it is made possible to suppress such a phase variation of the clock that is caused by deterioration in the circuit characteristic, for instance.

The phase comparison between the input signal and the extracted clock signal are carried out by using the signal obtained by carrying out the 1/N frequency division with respect to the input signal and the signal obtained by carrying out the 1/(2N) frequency division with respect to the extracted clock signal, so that the internal circuit can be operated at a low speed, thus enabling the power consumption by the clock extraction circuit to be reduced.

The entire disclosure of Japanese Patent Application No. 11-229066 filed on Aug. 13, 1999 including specification, claims drawings and summary is incorporated herein by reference in its entirety.

What is claimed is:

1. A clock extraction circuit comprising:
   a differential circuit operable to differentiate an input data signal at a rising or falling edge thereof and to generate a differential pulse;
   a first monostable multivibrator connected with said differential circuit and operable to output a first pulse signal in synchronization with the differential pulse;

a second monostable multivibrator connected with said first monostable multivibrator and operable to output a second pulse signal in synchronization with the first pulse signal;

an OR circuit operable to carry out a logical OR between the first pulse signal and the second pulse signal; and circuitry connected with said OR circuit and operable to variably chance the pulse width of the output pulse signal outputted from said OR circuit, wherein said circuitry comprises a delay circuit operable to delay the output pulse signal from said OR circuit and an RS flip-flop circuit operable to be set by the output signal from said OR circuit and to be reset by the output signal from said delay circuit.

2. A clock extraction circuit comprising:

a differential circuit operable to differentiate an input data signal at a rising or falling edge thereof and to generate a differential pulse;

a first monostable multivibrator connected with said differential circuit and operable to output a first pulse signal in synchronization with the differential pulse;

a second monostable multivibrator connected with said first monostable multivibrator and operable to output a second pulse signal in synchronization with the first pulse signal;

an OR circuit operable to carry out a logical OR between the first pulse signal and the second pulse signal; and circuitry connected with said OR circuit and operable to variably change the pulse width of the output pulse signal outputted from said OR circuit, wherein said circuitry comprises a third monostable multivibrator operable to output a pulse signal in synchronization with the output pulse signal outputted from said OR circuit.

3. A clock extraction circuit comprising:

a non-linear extraction circuit operable to extract clock frequency components from an input data signal;

a timing filter operable to extract only a fundamental frequency component from the clock frequency components;

a limiting amplifier operable to convert a sinusoidal signal outputted from said timing filter into a rectangular signal;

a ½ frequency divider operable to carry out ½ frequency division with respect to the output signal from said limiting amplifier;

an EXOR circuit operable to carry out a logical EXOR between the output signal from said ½ frequency divider and the input data signal;

an average value detector connected with said EXOR circuit and operable to detect the average value of the output signal from said EXOR circuit;

a comparator operable to compare the output voltage of said average value detector with a reference voltage;

a low-pass filter connected with said comparator and operable to pass only a low frequency part of the output signal from said comparator; and a phase varying device connected with said low-pass filter and operable to control a phase of the output signal from said non-linear extraction circuit.

4. A clock extraction circuit comprising:

a differential circuit operable to differentiate an input data signal at a rising or falling edge thereof and to generate a differential pulse;

a first monostable multivibrator connected with said differential circuit and operable to output a first pulse signal in synchronization with the differential pulse;

a second monostable multivibrator connected with said first monostable multivibrator and operable to output a second pulse signal in synchronization with the first pulse signal;

an OR circuit operable to carry out a logical OR between the first pulse signal and the second pulse signal;

circuitry connected with said OR circuit and operable to variably change the pulse width of the output pulse signal outputted from said OR circuit;

a timing filter connected with said circuitry and operable to extract only a fundamental frequency component from the frequency components of the output signal from said circuitry;

a limiting amplifier connected with said timing filter and operable to convert a sinusoidal signal outputted from said timing filter into a rectangular signal;

a ½ frequency divider operable to carry out ½ frequency division with respect to the output signal from said limiting amplifier;

an EXOR circuit operable to carry out the logical EXOR between the output signal from said ½ frequency divider and the input data signal;

an average value detector connected with said EXOR circuit and operable to detect the average value of the output signal from said EXOR circuit;

a comparator operable to compare the output voltage of said average value detector with a reference voltage; and a low-pass filter connected with said comparator and operable to pass only a low frequency part of the output signal from said comparator, and to supply the passed low frequency part to said first monostable multivibrator.

5. A clock extraction circuit as claimed in claim 4, wherein said first monostable multivibrator includes a variable capacitance diode operable to vary a capacitance thereof in response to a voltage applied thereto; and wherein said low-pass filter is connected with said variable capacitance diode.

6. A clock extraction circuit as claimed in claim 5, wherein said first monostable multivibrator comprises a first capacitor and is connected with a first variable resistor, and wherein the phase difference between the differential pulse and the first pulse signal is adjustable based on the capacitance value of said first capacitor, the capacitance value of said variable capacitance diode, and the resistance value of said first variable resistor.

7. A clock extraction circuit comprising:

a differential circuit operable to differentiate an input data signal at a rising or falling edge thereof and to generate a differential pulse;

a first monostable multivibrator connected with said differential circuit and operable to output a first pulse signal in synchronization with the differential pulse;

a second monostable multivibrator connected with said first monostable multivibrator and operable to output a second pulse signal in synchronization with the first pulse signal;

an OR circuit operable to carry out a logical OR between the first pulse signal and the second pulse signal;

circuitry connected with said OR circuit and operable to variably change the pulse width of the output pulse signal outputted from said OR circuit;

a timing filter connected with said circuitry and operable to extract only a fundamental frequency component from the frequency components of the output signal from said circuitry;

a limiting amplifier connected with said timing filter and operable to convert a sinusoidal signal outputted from said timing filter into a rectangular signal;

a 1/(2N) frequency divider operable to carry out 1/(2N) frequency division with respect to the output signal from said limiting amplifier;

a 1/N frequency divider operable to carry out 1N frequency division with respect to the input data signal;

an EXOR circuit operable to carry out logical EXOR between the output signal from said 1/(2N) frequency divider and the output signal from said 1/N frequency divider;

an average value detector connected with said EXOR circuit and operable to detect the average value of the output signal from said EXOR circuit;

a comparator operable to compare the output voltage of said average value detector with a reference voltage; and a low-pass filter connected with said comparator and operable to pass, only a low frequency part of the output signal from said comparator and to supply the passed low frequency part to said first monostable multivibrator.

8. A clock extraction circuit as claimed in claim 7, wherein said first monostable multivibrator includes a variable capacitance diode operable to vary a capacitance thereof in response to a voltage applied thereto; and wherein said low-pass filter is connected with said variable capacitance diode.

9. A clock extraction circuit as claimed in claim 8 wherein said first monostable multivibrator comprises a first capacitor and is connected with a first variable resistor, and wherein the phase difference between the differential pulse and the first pulse signal is adjustable based on the capacitance value of said first capacitor, the capacitance value of said variable capacitance diode, and the resistance value of said first variable resistor.

* * * * *